(12) United States Patent
Pu et al.

(10) Patent No.: US 10,573,847 B2
(45) Date of Patent: Feb. 25, 2020

(54) DISPLAY SUBSTRATE, MANUFACTURING METHOD THEREOF, AND DISPLAY DEVICE

(71) Applicants: BOE TECHNOLOGY GROUP CO., LTD., Beijing (CN); Chongqing BOE Optoelectronics Technology Co., Ltd., Chongqing (CN)

(72) Inventors: Xun Pu, Beijing (CN); Xin Bi, Beijing (CN); Jiandong Guo, Beijing (CN)

(73) Assignees: BOE TECHNOLOGY GROUP CO., LTD., Beijing (CN); CHONGQING BOE OPTOELECTRONICS TECHNOLOGY CO., LTD., Chongqing (CN)

( * ) Notice: Subject to any disclaimer, the term of this patent is extended or adjusted under 35 U.S.C. 154(b) by 0 days.

(21) Appl. No.: 15/975,763

(22) Filed: May 9, 2018

(65) Prior Publication Data
US 2019/0131576 A1  May 2, 2019

(30) Foreign Application Priority Data
Oct. 26, 2017 (CN) .......................... 2017 1 1029353

(51) Int. Cl.
| H01L 51/52 | (2006.01) |
| H01L 27/32 | (2006.01) |
| H01L 51/56 | (2006.01) |
| H01L 51/00 | (2006.01) |

(52) U.S. Cl.
CPC ...... H01L 51/5271 (2013.01); H01L 27/3262 (2013.01); H01L 27/3272 (2013.01); H01L 51/5268 (2013.01); H01L 51/56 (2013.01); H01L 51/0096 (2013.01)

(58) Field of Classification Search
CPC . H01L 27/3262; H01L 51/5271; H01L 51/56; H01L 51/5268; H01L 51/0071; H01L 51/0096; H01L 51/5012
USPC ....... 257/40, 59, 72, 89; 438/82, 99, 48, 128
See application file for complete search history.

(56) References Cited

U.S. PATENT DOCUMENTS

| 9,660,192 B2 | 5/2017 | Ren | |
| 2012/0138937 A1* | 6/2012 | Jo et al. ............... | H01L 27/2128 257/59 |
| 2014/0077174 A1* | 3/2014 | Park et al. .......... | H01L 51/5271 257/40 |
| 2014/0138649 A1 | 5/2014 | Chen et al. | |

(Continued)

FOREIGN PATENT DOCUMENTS

| CN | 103050639 A | 4/2013 |
| CN | 103681773 A | 3/2014 |

(Continued)

OTHER PUBLICATIONS

First Chinese Office Action dated Jul. 17, 2019, received for corresponding Chinese Application No. 201711029353.4.

Primary Examiner — Thinh T Nguyen
(74) Attorney, Agent, or Firm — Kinney & Lange, P.A.

(57) ABSTRACT

Disclosed are a display substrate, a manufacturing method thereof, and a display device. The display substrate of the embodiments of the present disclosure comprises a base substrate, a scattering layer on the base substrate, and a reflecting layer pattern on a side of the scattering layer away from the base substrate.

10 Claims, 4 Drawing Sheets

(56) References Cited

U.S. PATENT DOCUMENTS

| | | | |
|---|---|---|---|
| 2014/0291635 A1* | 10/2014 | Cho | ................... H01L 51/5271 257/40 |
| 2016/0013415 A1 | 1/2016 | Ren | |
| 2017/0018741 A1* | 1/2017 | Osawa | ................ H01L 51/5268 |
| 2017/0125740 A1 | 5/2017 | Lee et al. | |

FOREIGN PATENT DOCUMENTS

| | | |
|---|---|---|
| CN | 105489780 A | 4/2016 |
| CN | 106653800 A | 5/2017 |

* cited by examiner

DISPLAY SUBSTRATE, MANUFACTURING METHOD THEREOF, AND DISPLAY DEVICE

CROSS REFERENCE TO RELATED APPLICATION

The present application claims a priority benefit of Chinese Patent Application No. 201711029353.4, filed on Oct. 26, 2017, the entire contents thereof being incorporated herein by reference.

TECHNICAL FIELD

The embodiments of the present disclosure relate to the technical field of display, and particularly to a display substrate, a manufacturing method thereof, and a display device.

BACKGROUND

Organic light-emitting devices (OLEDs) are a kind of display device different from conventional liquid crystal displays (LCDs). OLEDs have advantages of active light emission, good temperature characteristic, low power consumption, rapid response, being bendable, being ultra-light and ultra-thin, low cost and the like, and thus, they have become one of important developments and findings of the new generation display devices, and have attracted more and more attentions.

OLED display substrates can be classified into the following three types depending on the light output direction: a bottom emitting type OLED, a top emitting type OLED, and a double-side emitting type OLED. Here, the bottom emitting type OLED refers to an OLED in which a light is emitted from the substrate side. Further, the double-side emitting type OLED refers to an OLED in which lights are emitted from both surfaces of the OLED.

SUMMARY

Embodiments of the present disclosure provide a display substrate, a manufacturing method thereof, and a display device, which are especially applicable in the technical field of OLED.

In one aspect, the embodiments of the present disclosure provide a display substrate comprising: a base substrate; a scattering layer on the base substrate; and a reflecting layer pattern on a side of the scattering layer away from the base substrate.

Optionally, the display substrate is an OLED display substrate.

Optionally, an orthographic projection of the reflecting layer pattern on the base substrate at least partially covers an orthographic projection of a thin film transistor of the OLED display substrate on the base substrate.

Optionally, the reflecting layer pattern is on a side of the thin film transistor close to the base substrate.

Optionally, an orthographic projection of the reflecting layer pattern on the base substrate and an orthographic projection of an OLED functional layer on the base substrate are not overlapped.

Optionally, the OLED functional layer comprises an organic light emitting layer.

Optionally, the reflecting layer pattern is made of a metal material.

Optionally, the thin film transistor has a bottom gate structure, and a gate electrode constitutes at least a part of the reflecting layer pattern.

Optionally, the display substrate further comprises a buffer layer;
wherein the buffer layer is on a side of the reflecting layer pattern away from the base substrate.

Optionally, the display substrate is a bottom emitting type display substrate or a double-side emitting type display substrate.

In another aspect, the embodiments of the present disclosure also provide a display device comprising the above-mentioned display substrate.

In another aspect, the embodiments of the present disclosure further provide a method for manufacturing the above-mentioned display substrate, comprising:
forming a scattering layer on a base substrate; and
forming a reflecting layer pattern on a side of the scattering layer away from the base substrate.

Optionally, the method further comprises: forming an OLED functional layer on the base substrate having the scattering layer and the reflecting layer pattern formed thereon.

Optionally, an orthographic projection of the reflecting layer pattern on the base substrate at least partially covers an orthographic projection of a thin film transistor of the display substrate on the base substrate.

Optionally, an orthographic projection of the reflecting layer pattern on the base substrate and an orthographic projection of the OLED functional layer on the base substrate are not overlapped.

Optionally, said forming the scattering layer on the base substrate comprises:
coating a light scattering material on the base substrate to form the scattering layer.

Optionally, said forming the reflecting layer pattern on a side of the scattering layer away from the base substrate comprises:
depositing a metal thin film on the scattering layer; and
forming the reflecting layer pattern through a patterning process.

Optionally, after forming the reflecting layer pattern, the method further comprises:
depositing a buffer layer on the reflecting layer pattern.

BRIEF DESCRIPTION OF DRAWINGS

The drawings are used to provide further understandings of the technical solutions of the present disclosure, and form a part of the description. The drawings together with the embodiments of the present application are used to explain, but not to limit the technical solutions of the present disclosure.

DETAILED DESCRIPTION

In order to make the objects, technical solutions and advantages of the present disclosure more clear and apparent, the embodiments of the present disclosure will be described in detail below with reference to the drawings. It should be noted that, unless contradiction, the embodiments of the present application and the features in the embodiments can be combined with each other arbitrarily.

Unless otherwise defined, the technical terms or scientific terms used in the embodiments of the present disclosure have usual meanings understood by a person of ordinary skills in the art. The words "first", "second" and the like used in the embodiments of the present disclosure do not indicate any order, number or importance, and are merely intended to distinguish different components. The word "comprise" or "include" or the like means that an element or article present before this word encompasses element(s) or article(s) listed after this word or equivalent(s) thereof, but it does not exclude other element(s) or article(s). The word "connect" or "link" or the like is not limited to a physical or mechanical connection, and may comprise an electrical connection, either directly or indirectly. The words "above", "below", "left", "right" and the like are only used to indicate relative position relationship. When the absolute position of the object referred to is changed, the relative position relationship may be changed accordingly.

After research, the inventors find that because no light is output from a thin film transistor area of a pixel in a bottom emitting type OLED display substrate, the pixel aperture area of the OLED display substrate becomes smaller and smaller as the number of thin film transistors in the display substrate increases, which in turn influences the light output area of the OLED display substrate, resulting in a relatively low light output ratio of the OLED display substrate.

Accordingly, the embodiments of the present disclosure provide a display substrate, a manufacturing method thereof, and a display device, to at least partially solve the technical problem of relatively low light output ratio of the display substrate.

Figure 1:
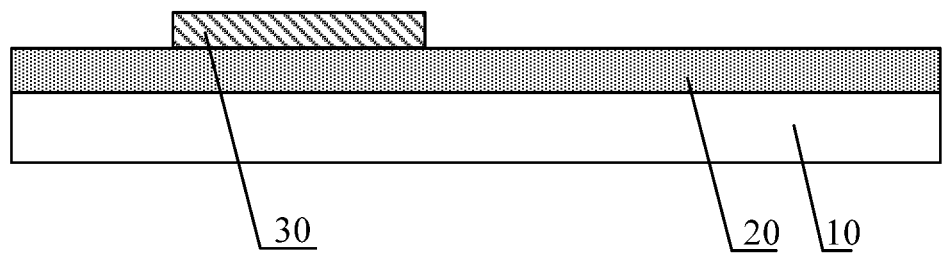
FIG. 1 is a structural schematic diagram of a display substrate provided in an embodiment of the present disclosure.

FIG. 1 shows a structural schematic diagram of a display substrate provided in an embodiment of the present disclosure. As shown in FIG. 1, the display substrate provided in the embodiment comprises: a base substrate 10; a scattering layer 20 on the base substrate 10; and a reflecting layer pattern 30 on a side of the scattering layer 20 away from the base substrate 10.

The scattering layer 20 on the base substrate 10 is used for scattering a light emitted by a light emitting layer in the display substrate, and the reflecting layer pattern 30 can reflect the scattered light received by it, as a result, the light output area of the display substrate is expanded, and the light output ratio of the display substrate is increased.

It should be noted that the display substrate provided in the embodiments of the present disclosure includes display substrates in various forms, such as an OLED display substrate, a LED display substrate, a LCD display substrate and the like. The embodiments of the present disclosure are described in detail below only taking an OLED display substrate as example.

Figure 2:
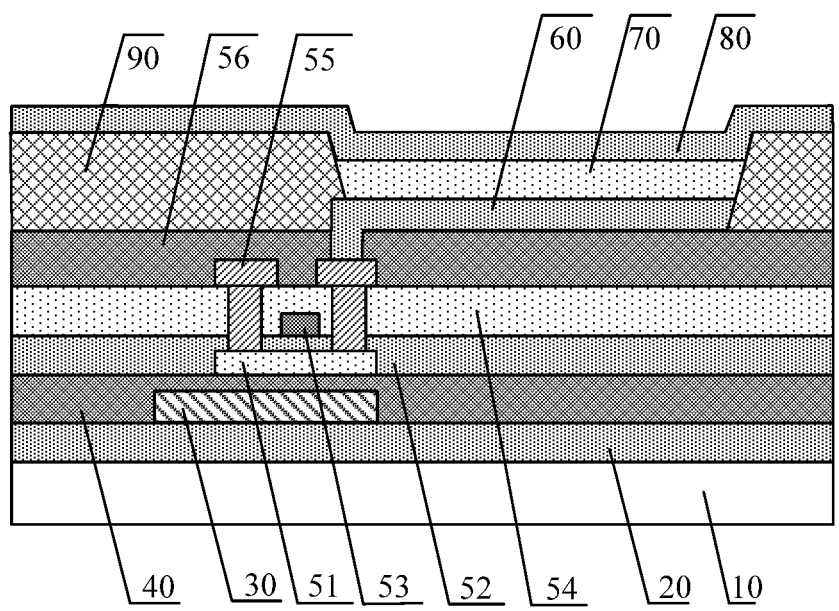
FIG. 2 is a structural schematic diagram of an OLED display substrate provided in an embodiment of the present disclosure.

FIG. 2 is a structural schematic diagram of an OLED display substrate provided in an embodiment of the present disclosure. As shown in FIG. 2, the OLED display substrate provided in the embodiment comprises an OLED functional layer 70 on a base substrate 10, and further comprises a scattering layer 20 for scattering a light emitted by the OLED functional layer 70 and a reflecting layer pattern 30 for outwardly reflecting the light scattered by the scattering layer 20, on the base substrate.

Particularly, the OLED display substrate further comprises: a thin film transistor on the base substrate 10, an anode 60 connected with a drain electrode of the thin film transistor, a pixel defining layer 90, and a cathode 80.

Particularly, the thin film transistor may have a bottom gate structure or a top gate structure, and may comprise: an active layer 51, a gate insulating layer 52, a gate electrode 53, an interlayer insulating layer 54, source/drain electrodes 55, and a passivation layer 56. It should be understood that FIG. 2 illustrates a top gate structure as example, but the present disclosure is not limited thereto.

It should be noted that the OLED display substrate as shown in FIG. 2 is a bottom emitting type OLED display substrate, that is to say, a light emitted by the OLED functional layer is emitted out through the anode. However, the embodiments of the present disclosure are not limited thereto, and the OLED display substrate may also be a double-side emitting type OLED display substrate.

Figure 3:
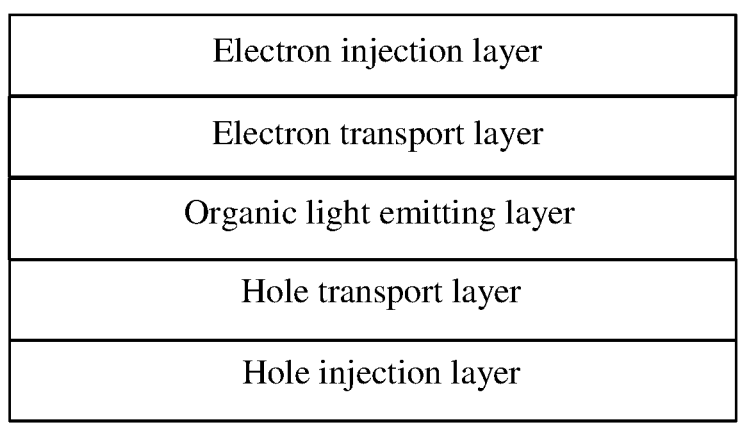
FIG. 3 is a structural schematic diagram of an OLED functional layer provided in an embodiment of the present disclosure.

FIG. 3 is a structural schematic diagram of an OLED functional layer provided in an embodiment of the present disclosure. As shown in FIG. 3, the OLED functional layer comprises an electron injection layer, an electron transport layer, an organic light emitting layer, a hole injection layer, and a hole transport layer. The electron injection layer and the hole injection layer are disposed on the upside and downside of the organic light emitting layer respectively. A hole injected from the anode and an electron injected from the cathode are combined to form an exciton in the organic light emitting layer. The exciton excites a light emitting molecule, and the excited light emitting molecule emits a visible light through a radiative relaxation. The hole transport layer is made from a hole transport material, and the hole transport material may be a triarylamine type compound, a biphenyldiamine derivative, or a crosslinked diamine biphenyl. The electron transport layer is made from an electron transport material, and the electron transport material may be a metal chelate, an azole compound, a phenanthroline derivative, or the like.

Optionally, the scattering layer 20 comprises a light scattering material. Particularly, the light scattering material comprises polyethylene terephthalate, polyethylene or polymethyl methacrylate, or may be another material capable of scattering a light, and this is not limited in the present disclosure.

Optionally, the reflecting layer pattern 30 comprises a metal or another material capable of reflecting light, and this is not limited in the present disclosure.

Particularly, the scattering layer 20 is disposed on the base substrate 10, and the reflecting layer pattern 30 is disposed on a side of the scattering layer 20 away from the base substrate 10.

Optionally, in order to avoid blocking the OLED functional layer and to further expand the light output area, the reflecting layer pattern 30 is disposed such that there is a spacing between an orthographic projection of the reflecting layer pattern 30 on the base substrate 10 and an orthographic projection of the OLED functional layer 70 on the base substrate 10, that is, the orthographic projection of the reflecting layer pattern 30 on the base substrate 10 and the orthographic projection of the OLED functional layer 70 on the base substrate 10 are not overlapped.

Optionally, the orthographic projection of the reflecting layer pattern 30 on the base substrate 10 covers an orthographic projection of a thin film transistor on the base substrate 10, such that the light scattered by the scattering layer 20 can be reflected by the reflecting layer pattern 30 as much as possible, to expand the aperture area of a pixel and increase the light output ratio to a maximum of 100%.

Optionally, as shown in FIG. 2, the OLED display substrate provided in the embodiment of the present disclosure further comprises a buffer layer 40; wherein the buffer layer 40 is on a side of the reflecting layer pattern 30 away from the base substrate 10.

Optionally, the material of the buffer layer 40 may be silicon oxide and/or silicon nitride, or a composite of silicon oxide and silicon nitride, and this is not limited in the present disclosure.

As the buffer layer is disposed in the embodiment of the present disclosure, on one hand, when the reflecting layer pattern is a metal, it can insulate the thin film transistor from the reflecting layer pattern, avoiding the interference of the reflecting layer pattern on the thin film transistor, on the other hand, it can have a flattening function, improving the yield rate.

It should be noted that FIG. 2 illustrates a TFT top gate structure as example. When the thin film transistor (TFT) has a bottom gate structure and the reflecting layer pattern 30 is a metal, the gate electrode of the TFT may constitute at least a part of the reflecting layer pattern 30. Here, the buffer layer has an insulating function, and may act as a gate insulating layer.

Figure 4:
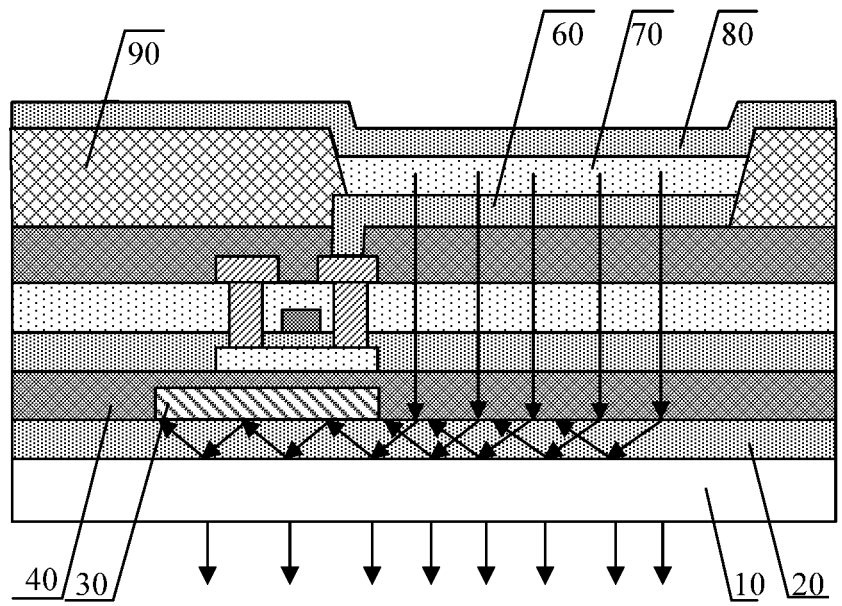
FIG. 4 is a schematic diagram showing a light travelling direction of an OLED display substrate provided in an embodiment of the present disclosure.

FIG. 4 is a schematic diagram showing a light travelling direction of an OLED display substrate provided in an embodiment of the present disclosure. As shown in FIG. 4, when lights emitted by the OLED functional layer reach the scattering layer 20, a portion of the lights travel through the scattering layer 20 and are emitted out directly through the base substrate 10, and the other portion of the lights are scattered around by the scattering layer 20. A portion of the scattered lights are reflected by the reflecting layer pattern 30, returned to the scattering layer 20 again, and in turn emitted out through the base substrate 10. As such, lights can also be emitted out from the thin film transistor area, which expands the light output area of the OLED display substrate and increases the light output ratio of the OLED display substrate.

In the embodiments of the present disclosure, by disposing a scattering layer and a reflecting layer to diffuse lights emitted by the OLED functional layer through scattering and reflecting, the light output area of the OLED display substrate is expanded and the light output ratio of the OLED display substrate is increased.

Figure 5:
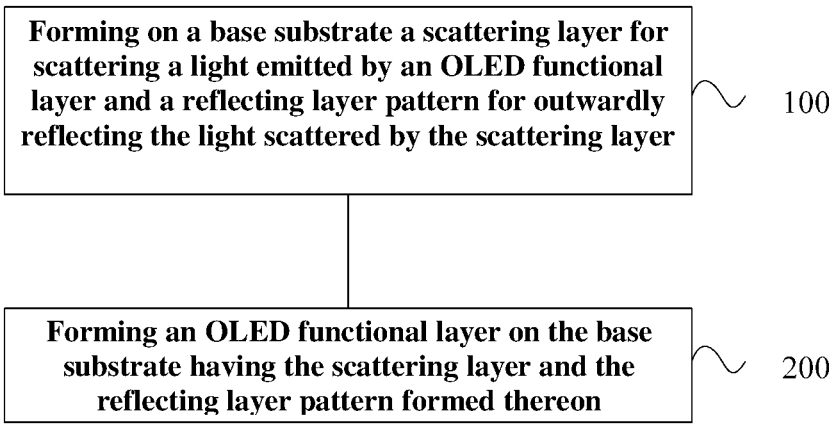
FIG. 5 is a flow chart of a method for manufacturing an OLED display substrate provided in an embodiment of the present disclosure.

Based on the inventive concept of the above embodiments, FIG. 5 is a flow chart of a method for manufacturing an OLED display substrate provided in an embodiment of the present disclosure. As shown in FIG. 5, the method for manufacturing an OLED display substrate provided in the embodiment of the present disclosure particularly comprises the following steps:

Step 100: forming on a base substrate a scattering layer for scattering a light emitted by an OLED functional layer and a reflecting layer pattern for outwardly reflecting the light scattered by the scattering layer.

Particularly, step 100 of forming a scattering layer and a reflecting layer pattern on a base substrate comprises: forming a scattering layer on a base substrate; and forming a reflecting layer pattern on the scattering layer.

Particularly, forming a scattering layer on a base substrate comprises applying a light scattering material on the base substrate to form a scattering layer.

Optionally, the light scattering material comprises polyethylene terephthalate, polyethylene or polymethyl methacrylate, or may be another material capable of scattering light, and this is not limited in the embodiments of the present disclosure.

Particularly, forming a reflecting layer pattern on the scattering layer comprises: depositing a metal thin film on the scattering layer; and forming a reflecting layer pattern through a patterning process.

Optionally, the metal thin film may be deposited by a plasma enhanced chemical vapor deposition (PECVD) process, an evaporation process or a sputtering process, and this is not limited in the present disclosure.

Optionally, the base substrate may be a glass substrate, a quartz substrate or a plastic substrate, and the base substrate may be pre-washed before forming the scattering layer and the reflecting layer.

Step 200: forming an OLED functional layer on the base substrate having the scattering layer and the reflecting layer pattern formed thereon.

It should be noted that there is a spacing between an orthographic projection of the reflecting layer pattern on the base substrate and an orthographic projection of an OLED functional layer on the base substrate, that is, the orthographic projection of the reflecting layer pattern on the base substrate and the orthographic projection of an OLED functional layer on the base substrate are not overlapped.

Particularly, the OLED functional layer comprises an electron injection layer, an electron transport layer, an organic light emitting layer, a hole injection layer, and a hole transport layer. The electron injection layer and the hole injection layer are disposed on the upside and downside of the organic light emitting layer respectively. A hole injected from the anode and an electron injected from the cathode are combined to form an exciton in the organic light emitting layer. The exciton excites a light emitting molecule, and the excited light emitting molecule emits a visible light through a radiative relaxation. The hole transport layer is made from a hole transport material, and the hole transport material may be a triarylamine type compound, a biphenyldiamine derivative, or a crosslinked diamine biphenyl. The electron transport layer is made from an electron transport material, and the electron transport material may be a metal chelate, an azole compound, a phenanthroline derivative, or the like.

The method for manufacturing an OLED display substrate provided in the embodiments of the present disclosure comprises: forming on a base substrate a scattering layer for scattering a light emitted by an OLED functional layer and a reflecting layer pattern for outwardly reflecting the light scattered by the scattering layer, and forming an OLED functional layer on the base substrate having the scattering layer and the reflecting layer pattern formed thereon, where, by disposing the scattering layer and the reflecting layer to diffuse the light emitted by the OLED functional layer through scattering and reflecting, the light output area of the OLED display substrate is expanded and the light output ratio of the OLED display substrate is increased.

Optionally, before step 200, the method provided in the embodiments of the present disclosure further comprises:

forming a buffer layer on the reflecting layer pattern.

Optionally, the material of the buffer layer may be silicon oxide and/or silicon nitride, or a composite of silicon oxide and silicon nitride, and this is not limited in the present disclosure.

Optionally, the buffer layer may be deposited by a plasma enhanced chemical vapor deposition (PECVD) process, or the buffer layer may be disposed by a low pressure chemical vapor deposition (LPCVD) process or a sputtering process.

It should be noted that if the buffer layer is formed by a PECVD or LPCVD deposition process, the deposition temperature is required to be controlled below 600° C.

A method for manufacturing an OLED display substrate provided in an embodiment of the present disclosure is further described in detail below with reference to FIGS. 6A to 6E, wherein, the patterning process referred comprises processes of photoresist applying, exposing, developing, etching, photoresist stripping and the like.

Figure 6A:
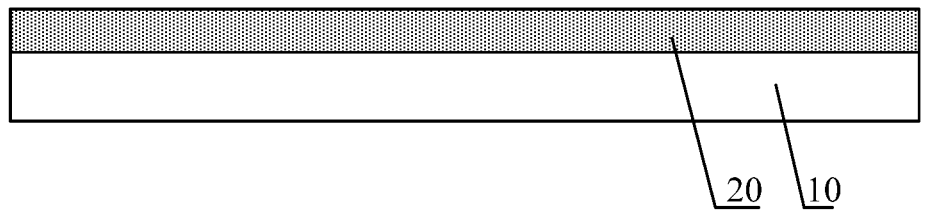
FIG. 6A is a schematic diagram I showing a manufacture procedure of an OLED display substrate provided in an embodiment of the present disclosure.

Step 301: applying a light scattering material on the base substrate 10 to form a scattering layer 20, as shown in FIG. 6A.

Here, the base substrate 10 may be a glass substrate, a quartz substrate or a plastic substrate, and before forming a scattering layer, the substrate may be pre-washed. The light scattering material comprises polyethylene terephthalate, polyethylene or polymethyl methacrylate, or may be another material capable of scattering a light, and this is not limited in the embodiments of the present disclosure.

Figure 6B:
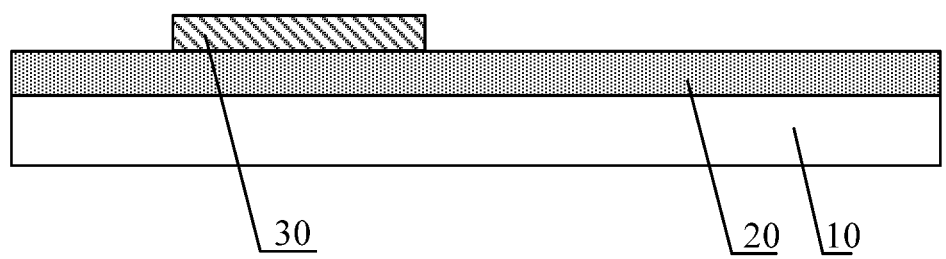
FIG. 6B is a schematic diagram II showing a manufacture procedure of an OLED display substrate provided in an embodiment of the present disclosure.

Step 302: depositing a metal thin film on the scattering layer 20, and forming a reflecting layer pattern 30 through a patterning process, as shown in FIG. 6B.

Figure 6C:
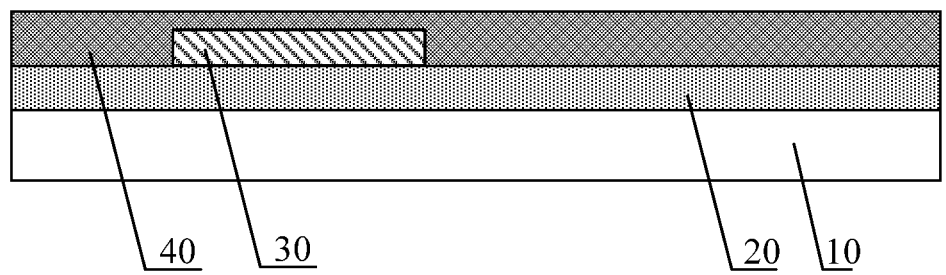
FIG. 6C is a schematic diagram III showing a manufacture procedure of an OLED display substrate provided in an embodiment of the present disclosure.

Step 303: forming a buffer layer 40 on the reflecting layer pattern 30, the buffer layer 40 covering the entire base substrate 10, as shown in FIG. 6C.

Here, the material of the buffer layer 40 includes silicon oxide and/or silicon nitride.

Figure 6D:
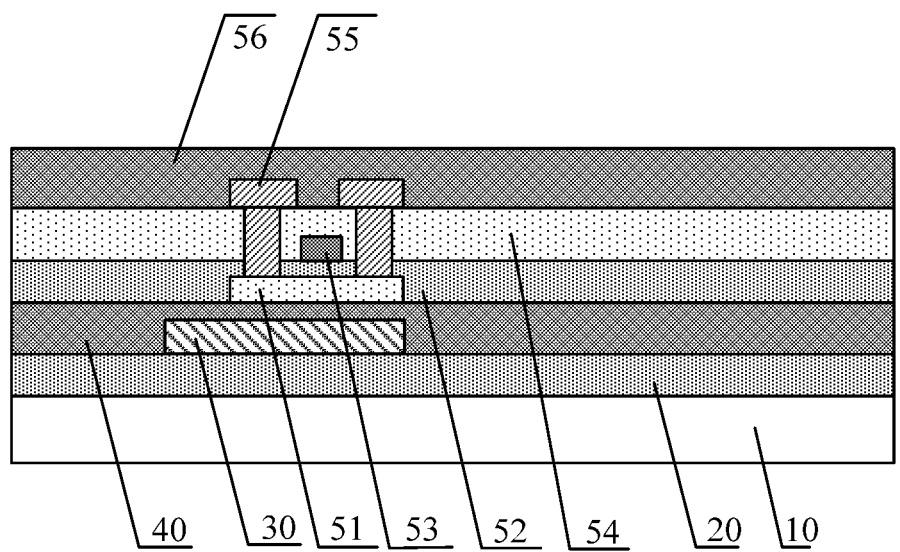
FIG. 6D is a schematic diagram IV showing a manufacture procedure of an OLED display substrate provided in an embodiment of the present disclosure.

Step 304: forming a thin film transistor on the buffer layer 40, as shown in FIG. 6D.

It should be noted that FIG. 6 illustrates a case where the thin film transistor has a top gate structure as example, and the thin film transistor may also have a bottom gate structure.

Particularly, if the thin film transistor has a top gate structure, forming the thin film transistor on the buffer layer 40 particularly comprises: forming an active layer 51 on the buffer layer 40; forming a gate insulating layer 52 on the active layer 51, the gate insulating layer 52 covering the entire base substrate 10; forming a gate electrode 53 on the gate insulating layer 52; forming an interlayer insulating layer 54 on the gate electrode 53; forming source/drain electrodes 55 on the interlayer insulating layer 54, wherein the source/drain electrodes 55 are connected with the active layer 51 through via holes penetrating the interlayer insulating layer and the gate insulating layer; and forming a passivation layer 56 on the source/drain electrodes 55, the passivation layer 56 covering the entire base substrate.

Figure 6E:
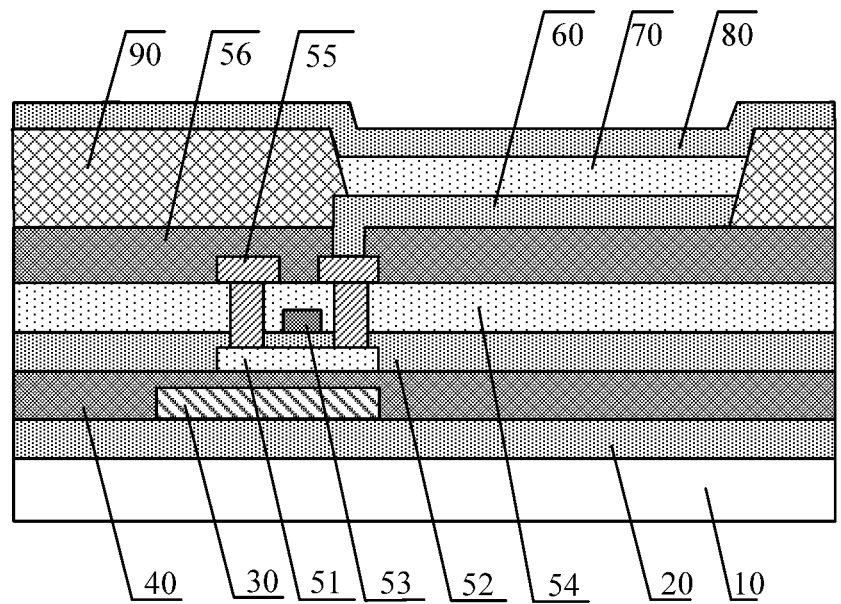
FIG. 6E is a schematic diagram V showing a manufacture procedure of an OLED display substrate provided in an embodiment of the present disclosure.

Step 305: forming an anode 60, a pixel defining layer 90, an OLED functional layer 70 and a cathode 80 sequentially on the thin film transistor, as shown in FIG. 6E.

Particularly, the anode 60 is connected with the drain electrode of the thin film transistor through a via hole penetrating the passivation layer.

Based on the inventive concept of the aforementioned embodiments, the embodiment of the present disclosure also provides a display device comprising an OLED display substrate.

Here, the OLED display substrate is the OLED display substrate provided in the embodiments of the present disclosure, and has a similar implementation principle and implementation effect, which will not be reiterated here.

It should be noted that the display device may be any product or component having a displaying function such as mobile phone, tablet computer, television, display, laptop, digital photo frame, navigator and the like, and this is not limited in the embodiments of the present disclosure.

The display substrate, the manufacture method thereof, and the display device provided according to the embodiments of the present disclosure comprise (forming) a scattering layer for scattering a light emitted by an OLED functional layer and a reflecting layer pattern for outwardly reflecting the light scattered by the scattering layer on a base substrate, such arrangement of the scattering layer and the reflecting layer pattern allows the light emitted by the OLED functional layer to be diffused out, so that it expands the light output area of the OLED display substrate and increases the light output ratio of the OLED display substrate.

Of course, any product or method of the present disclosure is not necessarily required to achieve all above-mentioned advantages at the same time. The objects and other advantages of the present disclosure can be achieved by the structures specified in the description, the claims and the drawings.

The following points should be noted.

The drawings for the embodiments of the present disclosure only relate to the structures involved in the embodiments of the present disclosure, and reference can be made to usual designs for other structures.

For clarity, in the drawings for describing the embodiments of the present disclosure, the thickness and size of a layer or a microstructure are enlarged. It should be understood that when an element such as a layer, a film, an area or a substrate is referred to as being positioned "above" or "below" another element, the element may be directly positioned "above" or "below" the another element, or there may be an intermediate element.

Unless contradiction, the embodiments of the present disclosure and the features in the embodiments can be combined with each other to obtain a new embodiment.

Although the embodiments of the present application are illustrated as above, the contents described are only for the convenience of understanding the present invention, but not intended to limit the present invention. One skilled in the art can make any modification or change on the forms and details of the embodiments without departing from the spirit and scope of the present application. The protection scope of the present invention is defined by the following claims.

What is claimed is:

1. An organic light emitting device (OLED) display substrate comprising:

a base substrate;

an OLED functional layer; and a thin film transistor,
wherein the OLED display substrate further comprises:
a scattering layer on the base substrate; and
a reflecting layer pattern between the scattering layer and the thin film transistor, and reflecting layer pattern being on a side of the scattering layer away from the base substrate and on a side of the thin film transistor close to the base substrate,
wherein an orthographic projection of the reflecting layer pattern on the base substrate at least partially covers an orthographic projection of the thin film transistor on the base substrate, and the orthographic projection of the reflecting layer pattern on the base substrate and an orthographic projection of the OLED functional layer on the base substrate are not overlapped.

2. The display substrate according to claim 1, wherein the OLED functional layer comprises an organic light emitting layer.

3. The display substrate according to claim 1, wherein the reflecting layer pattern is made of a metal material.

4. The display substrate according to claim 1, wherein the display substrate further comprises a buffer layer;
wherein the buffer layer is on a side of the reflecting layer pattern away from the base substrate.

5. The display substrate according to claim 1, wherein the display substrate is a bottom emitting type display substrate or a double-side emitting type display substrate.

6. A display device comprising the display substrate according to claim 1.

7. A method for manufacturing the OLED display substrate according to claim 1, comprising:
forming the scattering layer on the base substrate;
forming the reflecting layer pattern on the side of the scattering layer away from the base substrate; and
forming a thin film transistor and an OLED functional layer on the base substrate having the scattering layer and the reflecting layer pattern formed thereon,
wherein an orthographic projection of the reflecting layer pattern on the base substrate at least partially covers an orthographic projection of the thin film transistor on the base substrate, and
wherein the orthographic projection of the reflecting layer pattern on the base substrate and an orthographic projection of the OLED functional layer on the base substrate are not overlapped.

8. The method according to claim 7, wherein forming the scattering layer on the base substrate comprises:
coating a light scattering material on the base substrate to form the scattering layer.

9. The method according to claim 7, wherein forming the reflecting layer pattern on the side of the scattering layer away from the base substrate comprises:
depositing a metal thin film on the scattering layer; and
forming the reflecting layer pattern through a patterning process.

10. The method according to claim 7, wherein after forming the reflecting layer pattern, the method further comprises:
depositing a buffer layer on the reflecting layer pattern.

* * * * *